United States Patent [19]
Shin et al.

[11] Patent Number: 5,991,903
[45] Date of Patent: Nov. 23, 1999

[54] PARALLEL BIT TEST CIRCUIT FOR TESTING A SEMICONDUCTOR DEVICE IN PARALLEL BITS

[75] Inventors: Choong-Sun Shin, Seoul; Yong-Sik Seok, Suwon, both of Rep. of Korea

[73] Assignee: Samsung Electronics, Co., Ltd., Suwon, Rep. of Korea

[21] Appl. No.: 08/909,300

[22] Filed: Aug. 11, 1997

[30] Foreign Application Priority Data

Aug. 9, 1996 [KR] Rep. of Korea ........................ 96-33232

[51] Int. Cl.⁶ ............................. G11C 29/00; G06F 7/02
[52] U.S. Cl. ....................... 714/718; 714/735; 714/819
[58] Field of Search ............................ 371/21.1, 21.2, 371/24, 67.1, 68.1, 71; 365/200, 201, 189.04; 714/718, 719, 735, 819, 820, 821, 824, 736

[56] References Cited

U.S. PATENT DOCUMENTS

| | | | |
|---|---|---|---|
| 5,164,918 | 11/1992 | Ogino et al. | 365/201 |
| 5,400,281 | 3/1995 | Morigami | 365/201 |
| 5,483,493 | 1/1996 | Shin | 365/201 |
| 5,706,234 | 1/1998 | Pilch, Jr. et al. | 365/201 |
| 5,793,685 | 8/1998 | Suma | 365/201 |

*Primary Examiner*—Trinh L. Tu
*Attorney, Agent, or Firm*—Marger Johnson & McCollom, P.C.

[57] ABSTRACT

A novel parallel bit test circuit is provided to test a semiconductor memory device which comprises a number of memory cell arrays each having a plurality of memory cells, a word line provided in each memory cell array to commonly connect with the plurality of memory cells, and a plurality of I/O (input/output) lines respectively connected with the plurality of memory cells of each memory cell array. The parallel bit test circuit for testing the plurality of memory cells in parallel bits comprises a comparator for comparing the data of the memory cells with an externally input data to produce a test signal applied to a data I/O terminal.

6 Claims, 5 Drawing Sheets

PARALLEL BIT TEST CIRCUIT FOR TESTING A SEMICONDUCTOR DEVICE IN PARALLEL BITS

BACKGROUND OF THE INVENTION

1. Field of the Invention

The present invention concerns a semiconductor memory device, and more particularly a parallel bit test circuit for testing the memory cells in parallel bits.

2. Description of the Related Art

As a semiconductor memory device is more highly integrated, the time required for testing the memory cells is more increased, and thus the testing cost. For example, if the number of the memory cells of a tested memory device is N (natural number and the number of the data I/O (input/output) terminals "m" (natural number), the data read or write operation must be performed N/m times to access all the memory cells. However, in this case, if the data read or write operation can be carried out simultaneously for "n" (natural number) memory cells through each of the "m" I/O terminals, "N/(m×n)" times of performing the operation suffice accessing all the memory cells, reducing the test time to 1/n. This is called the parallel bit test or multi bit test.

Referring to FIGS. 1A and 1B for illustrating a conventional parallel bit test circuit, there are shown four memory cell arrays, each of which has a common word line and a common column selection line and a plurality of data I/O lines respectively connected with the memory cells. In this case, the number "m" of the I/O terminals is 4 and the number "n" of the tested memory cells also 4. For example, the first array "0" has four memory cells C00, C01, C02 and C03 commonly connected with the word line WL0 and column selection line CSL0 and with respective data I/O lines IO00, IO01, IO02 and IO03. The data of the four memory cells C00, C01, C02 and C03 are applied through their respective I/O lines IO00, IO01, IO02 and IO03 to a comparator consisting of an AND gate 100, NOR gate 101 and OR gate 102, which performs the operation for testing the memory cells as follows:

At first, if the four memory cells are all written with data "0" and there exists a failed cell, the data of the failed cell is read as "1" so as to cause the comparator to produce the data signal "0" representing the fail transferred to the data I/O terminal DQ0. If there is no failed cell, all the four memory cells are read as "0", thus transferring the data signal "1" representing no fail to the I/O terminal DQ0. Alternatively, if the four memory cells all written data "1" and there exists a failed cell, the data of the failed cell is read as "0" so as to cause the comparator to produce the data signal "0" representing the fail transferred to the data I/O terminal DQ0. If there is no failed cell, all the four memory cells are read as "1", thus transferring the data signal "1" representing no fail to the I/O terminal DQ0.

Thus, each of the four data I/O lines is used for simultaneously testing four data so that 16 bits (m×n) are tested in parallel reducing the test time to 1/n, i.e., ¼. However, the comparator may normally work provided all the four memory cells are normal or up to three memory cells are failed. Otherwise, if all the four memory cells are failed, the comparator fails to produce the data signal "0" representing the fail, but instead the data signal "1" representing no fail. For example, if the four memory cells are written with data "0" and all failed, the data of all the four memory cells are read as "1" so as to cause the comparator to produce the data "1". Alternatively, if the four memory cells are written with data "1" and all failed, the data of all the four memory cells are read as "0" so as to cause the comparator to produce the data "1". It is frequently caused by the word line stuck that the four memory cells are all failed.

SUMMARY OF THE INVENTION

It is an object of the present invention to provide a parallel bit test circuit for successfully detecting the fail that all of the memory cells having a common word line and a common column selection line are failed in a semiconductor memory device.

According to the present invention, a novel parallel bit test circuit is provided to test a semiconductor memory device which comprises a number of memory cell arrays each having a plurality of memory cells, a word line provided in each memory cell array to commonly connect with the plurality of memory cells, and a plurality of I/O (input/output) lines respectively connected with the plurality of memory cells of each memory cell array. The parallel bit test circuit for testing the plurality of memory cells in parallel bits comprises a comparator for comparing the data of the memory cells with an externally input data to produce a test signal applied to a data I/O terminal.

The present invention will now be described more specifically with reference to the drawings attached only by way of example. In the drawings, the same reference numerals are used to represent the similar functional relationships between the structural elements.

DETAILED DESCRIPTION OF THE PREFERRED EMBODIMENT

Figure 1A:
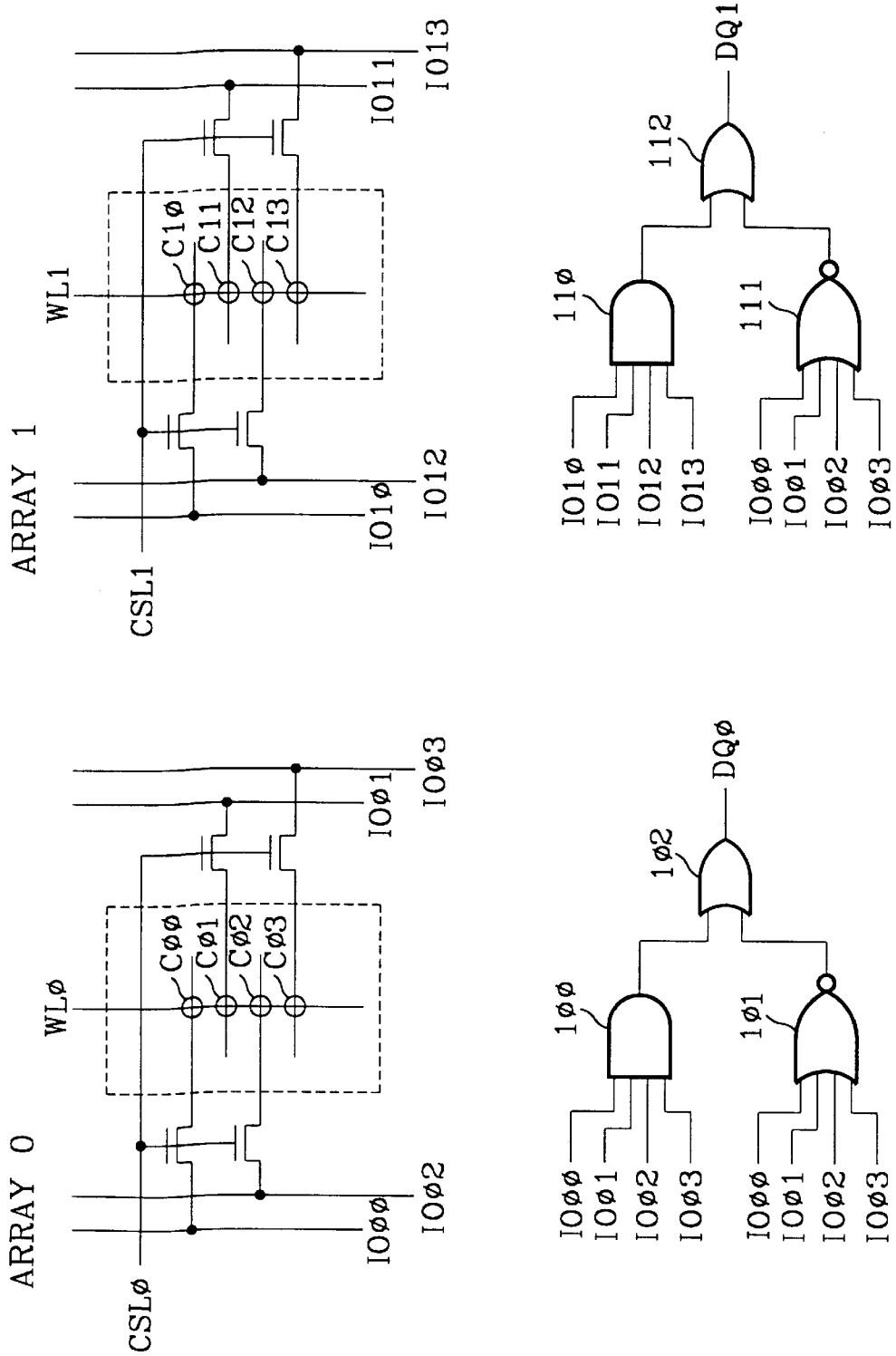
FIGS. 1A and 1B are detailed diagrams for illustrating a conventional parallel bit test circuit.
Figure 1B:
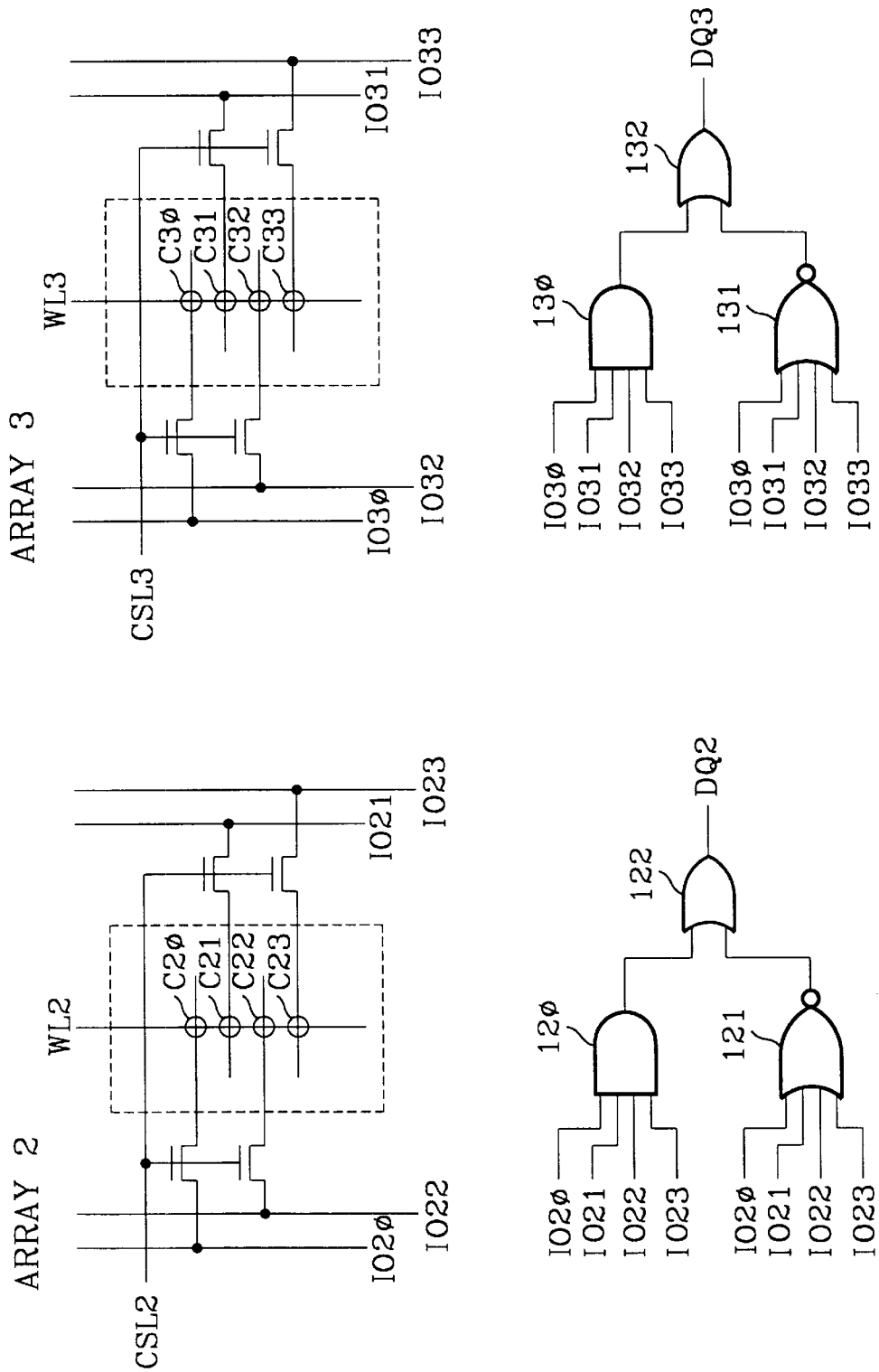
Figure 2A:
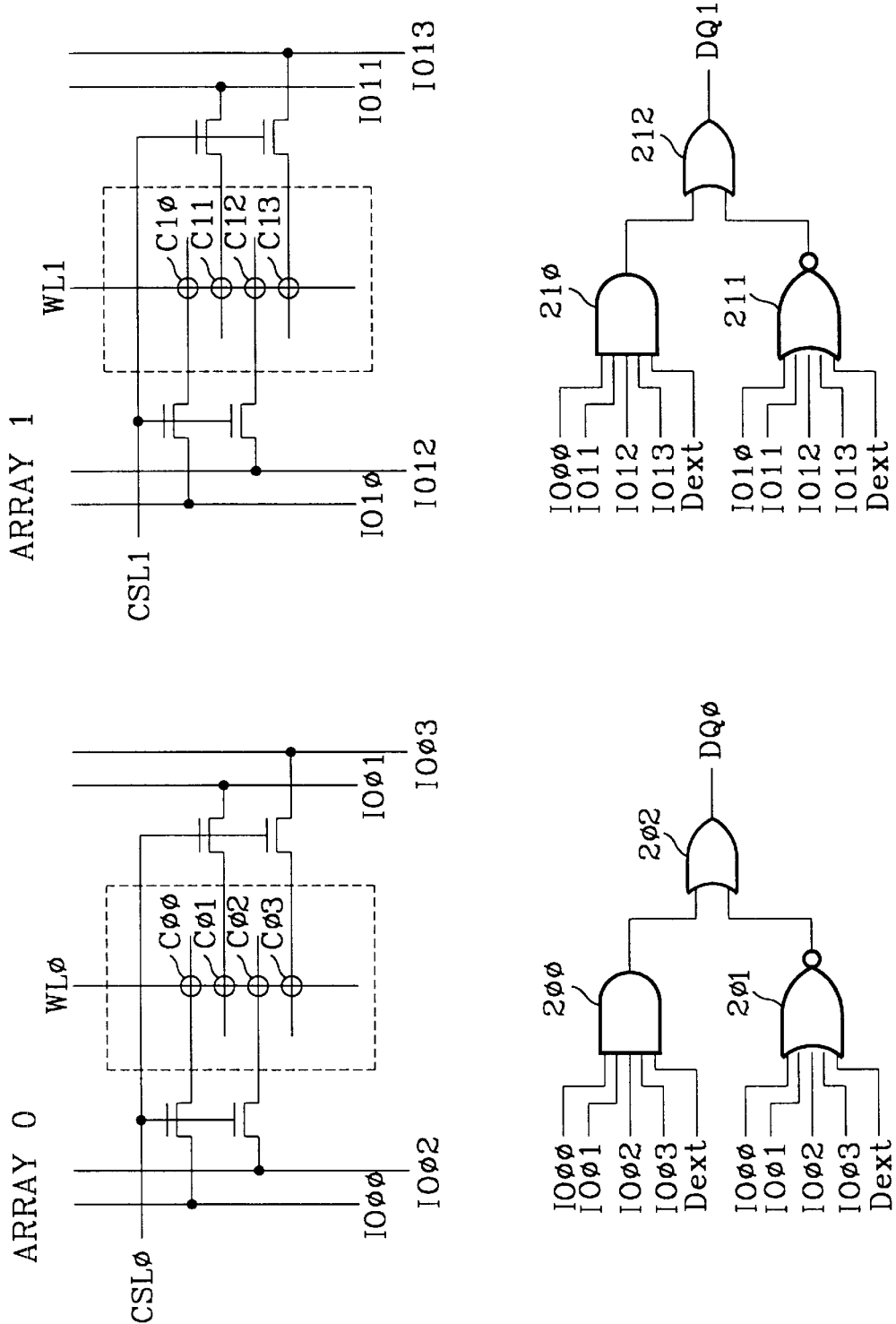
FIGS. 2A and 2B are detailed diagrams for illustrating a parallel bit test circuit according to the present invention.
Figure 2B:
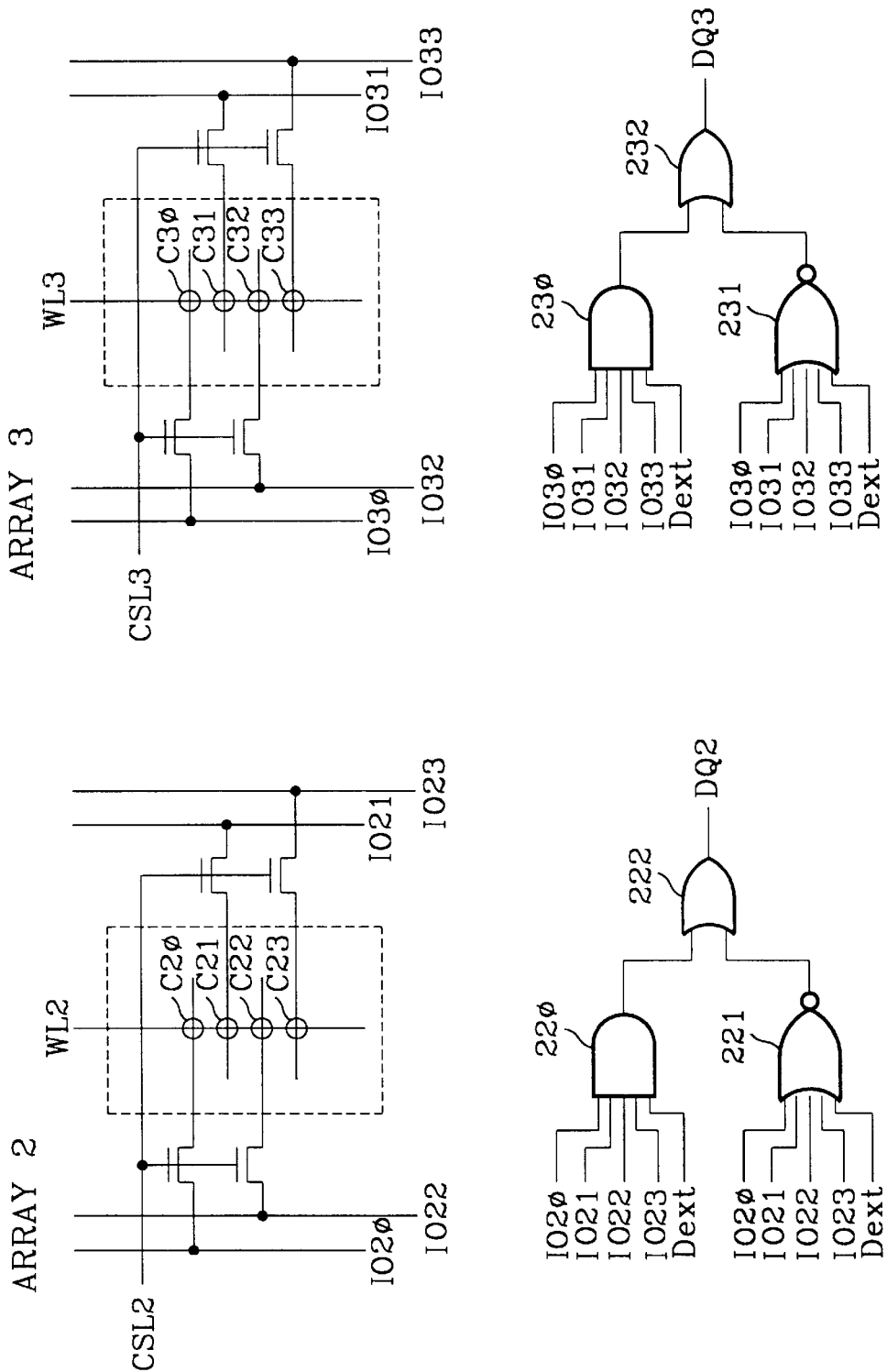

Referring to FIGS. 2A and 2B, the inventive parallel bit test circuit comprises an AND gate, a NOR gate and an OR gate. The AND gate and NOR gate each have an additional data input terminal. For example, the arrays 0–3 have their respective AND gates 200, 210, 220, 230 provided with an additional data input terminal Dext and NOR gates with an additional data input terminal Dext. The additional data input terminal Dext is applied externally with the same data as in the tested memory cells. Thus, when the data applied to the data input terminal Dext has the same value as the data written into the four memory cells to test, the data signal "1" is generated through the I/O terminal DQ representing no fail. However, if all the four memory cells are failed to give the inversion of the original data, having the logical state different from the data applied to the data input terminal Dext, the comparator produces the data signal "0" representing the fail. Hence, there does not occur such problem as the conventional parallel bit test circuit has inherently in the case of the word line stuck fail.

Figure 3:
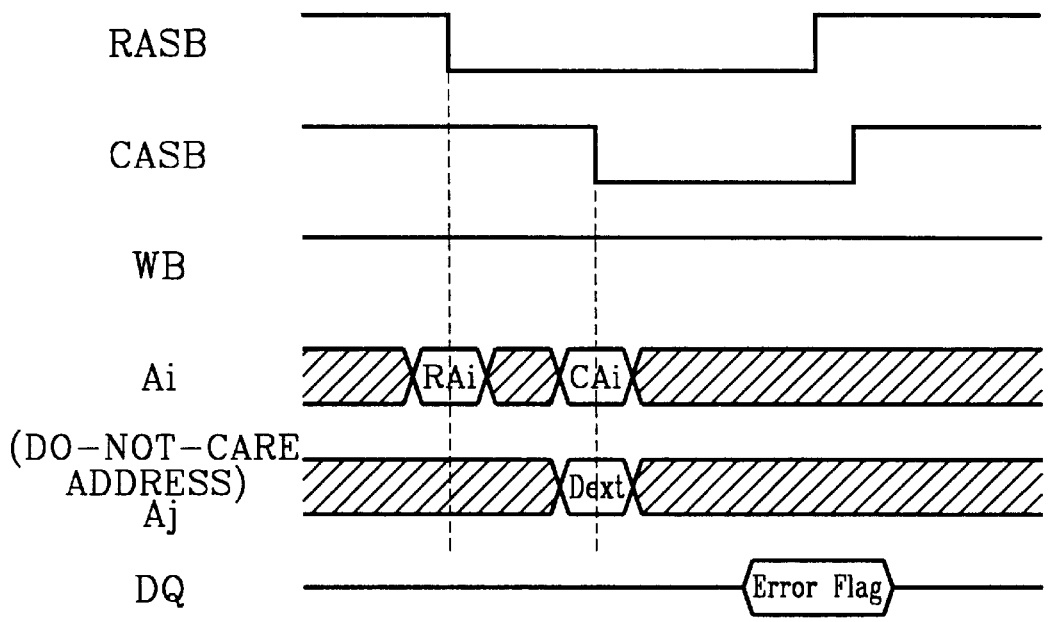
FIG. 3 is a timing diagram for illustrating the operation of the inventive parallel bit test circuit using don't care address.
Figure 4:
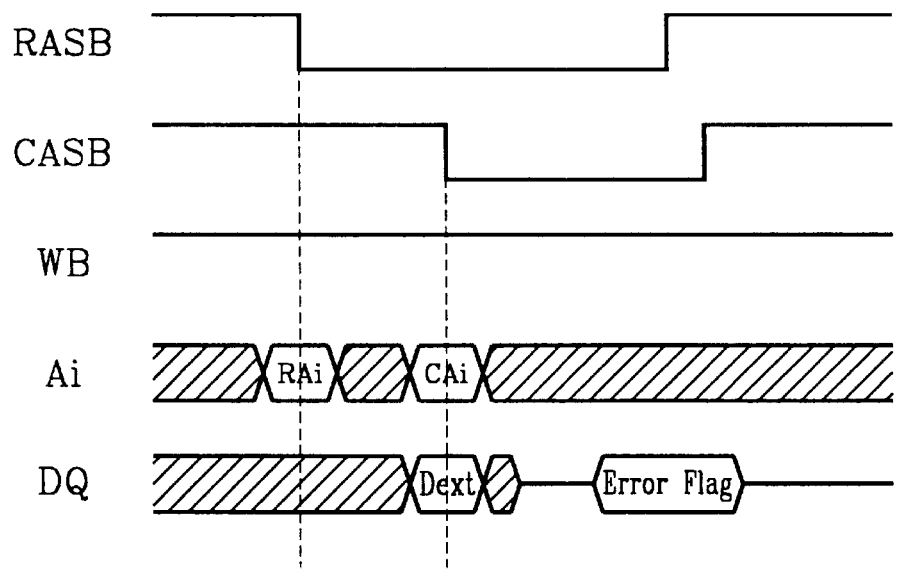
FIG. 4 is a timing diagram for illustrating the operation of the inventive parallel bit test circuit using a data I/O terminal to apply an external data to a comparator.

Various means may be used to supply an external data to the data input terminal Dext. For example, there may be provided an additional input terminal, especially an input pad for wafer testing. Another means is to use don't care address. The parallel bit test is performed to "n" data simultaneously, resulting in $\log_2 n$ don't care addresses. For n=4 in the present embodiment, there occur 2 ($\log_2 4$) don't care addresses, which are respectively connected with the data input terminals Dext, Dext to input data instead of addresses. FIG. 3 is a timing diagram for working the parallel bit test circuit to use the don't care address. The external data is applied through the don't care address input terminal in the form of a column address. Still another means is to use the ordinary data I/O terminal to apply the external data to the comparator, as shown in FIG. 4 for illustrating a timing diagram representing the data read operation of the dynamic random access memory (DRAM). In this case, the same I/O terminal is used to output the resultant data obtained by comparing the cell data with the external input data, and therefore the external input data should be stored into a memory location separately allocated in the DRAM. The cases of FIGS. 3 and 4 do not need an additional input pad.

As described above, the inventive parallel bit test circuit includes an additional means for comparing the data of the memory cells with an externally input data in a semiconductor memory device, thereby successfully detecting the fail that all of the memory cells having a common word line and a common column selection line are failed.

Although the present invention has been described in reference to the specific embodiments accompanying the attached drawings, it will be readily apparent to those skilled in this art that various modifications may be made without departing the gist of the present invention.

What is claimed is:

1. A parallel bit test circuit for simultaneously testing a plurality of memory cells comprising:

means for generating an externally generated test signal;

a plurality of memory cells;

a word line commonly connecting said plurality of memory cells to the externally generated signal;

a plurality of I/O lines, each of said plurality of memory cells having a respective I/O line through which a read data signal, responsive to the externally generated signal, is transmitted;

a first logic gate coupled to the plurality of I/O lines and to the externally generated signal for comparing read data from each of the plurality of memory cells with the externally generated signal and generating a first logic gate output signal;

a second logic gate coupled to the plurality of I/O lines and to the externally generated signal for comparing read data from each of the plurality of memory cells with the externally generated signal and generating a second logic gate output signal; and a third logic gate coupled to outputs from said first logic gate and to said second logic gate for logically combining the first logic gate output signal with the second logic gate output signal.

2. A parallel bit test circuit as defined in claim 1, wherein said first, second and third logic gates are respectively an AND gate, NOR gate and OR gate.

3. A parallel bit test circuit as defined in claim 1, wherein said means for generating an externally generated test signal includes an additionally provided input pad.

4. A parallel bit test circuit as defined in claim 1, wherein said means for generating an externally generated test signal includes an address input terminal.

5. A parallel bit test circuit as defined in claim 1, wherein said means for generating an externally generated test signal includes a data I/O terminal.

6. A method for testing memory cells in parallel comprising the steps of:

applying test data to a plurality of memory cells to be tested;

outputting read data from the plurality of memory cells responsive to the test data;

inputting the read data from the plurality of memory cells to respective inputs of a first and second logic gates;

inputting the test data to the first and second logic gates;

comparing the test data with the read data at the first logic gate resulting in a first logic gate output signal;

comparing the test data with the read data at the second logic gate resulting in a second logic gate output signal;

comparing said first logic gate output signal with said second logic gate output signal in a third logic gate; and outputting a fail signal responsive to the comparison of the first logic gate output signal with said second logic gate output signal.

* * * * *